(12) United States Patent
Ferrandon et al.

(10) Patent No.: US 8,912,620 B2
(45) Date of Patent: Dec. 16, 2014

(54) GETTER STRUCTURE WITH OPTIMIZED PUMPING CAPACITY

(75) Inventors: Christine Ferrandon, Sassenage (FR); Xavier Baillin, Crolles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 11 days.

(21) Appl. No.: 13/544,032

(22) Filed: Jul. 9, 2012

(65) Prior Publication Data
US 2013/0015568 A1    Jan. 17, 2013

(30) Foreign Application Priority Data

Jul. 11, 2011    (FR) ...................................... 11 56302

(51) Int. Cl.
*H01L 31/058*    (2006.01)
*B81B 7/00*    (2006.01)

(52) U.S. Cl.
CPC .................... *B81B 7/0038* (2013.01)
USPC .................... 257/467; 257/682; 257/E23.137

(58) Field of Classification Search
USPC .................... 257/467, 682, E23.137
See application file for complete search history.

(56) References Cited

U.S. PATENT DOCUMENTS

| 8,395,229 B2 * | 3/2013 | Garcia-Blanco et al. ..... 257/467 |
| 2009/0081434 A1 | 3/2009 | Sturland et al. |
| 2009/0261464 A1 | 10/2009 | Alie |
| 2010/0178419 A1 | 7/2010 | Baillin |
| 2010/0193215 A1 | 8/2010 | Baillin |

FOREIGN PATENT DOCUMENTS

| FR | 2 922 202 A1 | 4/2009 |
| WO | WO 2008/071906 A1 | 6/2008 |
| WO | WO 2009/087284 A1 | 7/2009 |

OTHER PUBLICATIONS

U.S. Appl. No. 13/530,596, filed Jun. 22, 2012, Caplet.
U.S. Appl. No. 13/530,513, filed Jun. 22, 2012, Caplet, et al.
Preliminary Search Report issued Feb. 1, 2012 in French Patent Application No. 1156302.
Matthew M. Hawkeye, et al., "Glancing angle deposition: Fabrication, properties, and applications of micro- and nanostructured thin films", Journal of Vacuum Science and Technology A: Vacuum, Surfaces and Films, vol. 25, No. 5, Sep. 2007, pp. 1317-1335.

* cited by examiner

*Primary Examiner* — Michael Shingleton
(74) *Attorney, Agent, or Firm* — Oblon, Spivak, McClelland, Maier & Neustadt, L.L.P.

(57) ABSTRACT

Getter structure comprising at least one getter portion arranged on a support and including at least two adjacent getter material parts arranged on the support one beside the other, with different thicknesses and of which the surface grain densities are different from one another.

12 Claims, 6 Drawing Sheets

GETTER STRUCTURE WITH OPTIMIZED PUMPING CAPACITY

TECHNICAL FIELD

This invention relates to the field of getter structures enabling gas absorption and/or adsorption to be performed.

The getter structure according to the invention may be used in particular in an encapsulation, or packaging, under controlled atmosphere, of one or more components, for example microsystems, in a hermetic cavity of which the cap is formed by a thin film (thin film packaging) or by attaching the cap (WLP, for "wafer level packaging").

PRIOR ART

Some devices, for example microsystems or components such as MEMS and/or NEMS or even infrared detectors, require, for successful operation, encapsulation in a controlled atmosphere (in terms of nature of the surrounding gas, pressure, temperature, and so on) and durable over time. When such a device is encapsulated in a cavity produced by attaching a cap on the substrate, or support, on which the device is produced, the assembly between the cap and the support forming the cavity must therefore be produced hermetically in order to prevent any gas exchange between the interior and the exterior of the cavity.

There are a number of methods that enable a hermetic seal of a cap attached on a substrate to be produced:
  sealing of the cap on the substrate by means of a glass-frit bead,
  metal sealing of the eutectic type or by thermo-compression,
  anodic sealing.

Some devices also must be encapsulated in a vacuum environment, for example at a pressure of between around 1 mbar to $10^{-3}$ mbar according to the type of device. During the hot sealing performed between the cap and the substrate, gas molecules may be produced during degassing or be voluntarily introduced into the cavity. In addition, over the lifetime of the device, other molecules may penetrate the cavity by fine leakages at the level of the cap-substrate junction. It is thus sometimes difficult to obtain and/or preserve the vacuum level required for successful operation of the device.

To solve this type of problem, materials called getter materials are used, which trap the gas molecules contaminating the gaseous environment in the cavity (for example of the $H_2O$, $CO_2$, $N_2$, $O_2$, $H_2$, etc. type) by a chemical reaction with them. Such a getter material therefore makes it possible to perform gas pumping by absorption and/or adsorption of these gas molecules. To adjust the pressure inside the cavity, it is therefore useful to have a getter material with a high pumping capacity.

A getter material performs gas pumping after having undergone a thermal treatment (the getter material is heated to a certain temperature) called thermal activation. During this treatment, the chemical species trapped at the surface (in particular of the C, N and O type) are dissolved by diffusion in the material in order to expose the metal surface, which is then capable of adsorbing other gas molecules. The dissolution in the material by diffusion is thermally activated and the activation energy is dependent on the diffusion mechanism involved. Thus, when the structure of the getter is formed by a plurality of small columnar grains, the diffusion takes place predominantly in the grain joints. The flow of material is then dependent on the grain joint density, which is therefore directly related to the grain surface density. By contrast, when the grains are larger, the diffusion takes place predominantly through the grains. In this latter case, the activation energy is higher, and is therefore produced at a higher temperature than the diffusion at the grain joints. The thermal activation of a getter is therefore closely dependent on its microstructure, i.e. its granular structure. The thin film getters generally have a columnar structure and the diffusion flow is controlled both by the grain surface density and by the temperature. For the same temperature, the flow is therefore proportional to the grain surface density.

It is wise to use a getter material of which the thermal activation temperature corresponds approximately to the temperature at which the sealing between the cap and the substrate is performed. Indeed, if the getter material has a thermal activation temperature that is greater than that necessary for the sealing, it is necessary to perform, after the sealing, an additional thermal treatment serving uniquely to perform the thermal activation of the getter material. Otherwise, when the getter material has a thermal activation temperature that is lower than that necessary for the sealing, the getter material is thermally activated before the end of the sealing, causing gas pumping by the getter material during sealing, thereby reducing the pumping capacities of the getter material once the sealing has been completed.

Thus, this thermal activation temperature of the getter material is advantageously between around 400° C. and 450° C. in the case of anodic sealing or by "glass-frit". In the case of metal sealing, the thermal activation temperature of the getter material is advantageously between around 350° C. and 400° C. in the case of Au/Au thermo-compression, or between around 280° C. and 330° C. in the case of the use of an AuSn-type eutectic, and can go down to between around 200° C. and 280° C. for other alloys.

Currently, to cover such ranges of thermal activation temperatures, the getter structures are produced in the form of multilayer deposits or are produced by using particular metal alloys, involving additional costs to produce such getter structures.

Document FR 2 922 202 describes a getter structure formed by a stack of a getter material and a sub-layer enabling the thermal activation temperature of the getter material to be adjusted.

The production of such a getter structure, however, involves the implementation of a number of steps of deposition and structuring of the layers deposited, thereby also increasing the cost of production of such a getter structure.

DESCRIPTION OF THE INVENTION

Thus there is a need to propose a new type of getter structure of which the production cost is lower than that of the getter structures of the prior art, of which the thermal activation temperature can be modulated (for example, adjustable between around 250° C. and 450° C.) and capable of being developed under standard deposition conditions. This new type of getter structure may also have, at an equivalent thermal budget, an adjustable pumping capacity (gas absorption and/or adsorption), and may be capable of being thermally activated during the sealing cycle of the cavity in which the getter structure is intended to be encapsulated.

For this, one embodiment of the invention proposes a getter structure comprising at least one getter portion arranged on a support and including at least two adjacent getter material parts with different thicknesses, and of which the surface grain densities are different from one another.

The getter material parts of the getter structure are arranged on the support one beside the other.

Thus, by modulating the proportion of the parts with different thicknesses, and of which the surface grain densities are different (for all or some of said getter material parts), in the getter portion, it is possible to modulate, and in particular to reduce, the thermal activation temperature of the getter structure and/or to modulate the pumping capacity of the getter structure.

The "surface grain density" of the getter material parts corresponds to the density of the columnar grains forming the getter material of these parts.

This getter structure therefore has properties (thermal activation temperature, pumping capacity) that are adjustable according to the design or pattern of the getter structure, i.e. according to the proportion of one or the other of the two parts of getter material in the getter portion. Thus, it is possible to produce a getter structure of which the thermal activation temperature may be between around 250° C. and 450° C.

In addition, this getter structure may be produced from a single getter material deposited in the form of one or more getter portions, separated or juxtaposed or overlapping, in a single step of deposition on the same support.

It is possible to produce, on the same support, a plurality of getter structures, each having different getter properties (thermal activation temperatures, pumping capacities), and capable, for example, of being used to produce different vacuum levels, or more generally different types of encapsulation, for a plurality of components, for example MEMS or NEMS microsystems, produced on this support. These getter structures may be produced from the same getter material deposited in a single step through a mask, with only the design of the openings formed through the mask in order to produce the deposition of getter material through these openings being different from one getter structure to another.

It is also possible to produce, on the same support, at least two getter structures having different thermal activation temperatures and used for encapsulation of a single component. One of the getter structures may have a thermal activation temperature approximately equal to the temperature used for encapsulation of the component, with this getter structure performing gas pumping during encapsulation.

The other getter structure may have a thermal activation temperature above that used for encapsulation of the component, and therefore performing gas pumping after the encapsulation, activated for example by heating in a furnace.

According to one embodiment of the invention, it is possible to produce a plurality of getter structures that can be thermally activated during annealings at different temperatures, with these getter structures being, for example, intended to be encapsulated in the same cavity.

The getter structure is capable of being thermally activated within a reasonable time at the industrial level, for example between around 30 min and 120 min, at a temperature of between around 250° C. and 450° C.

The getter portion may comprise at least one getter material layer. This getter material layer may comprise titanium or zirconium.

When the getter structure comprises a plurality of getter portions, these getter portions may comprise different getter materials from one another.

The getter material layer may cover at least another layer of material of the getter structure. The getter material layer can in particular cover one or more sub-layers of material (for example, comprising titanium and/or zirconium and/or chromium and/or platinum and/or molybdenum), with these sub-layers corresponding to additional layers for attachment and/or adjustment of the activation and/or getter temperature, as described in document FR 2 922 202.

The getter material layer may be protected, for example, by a protective layer which may comprise chromium or niobium.

The getter portions may be formed by one or more identical or different layers of getter material.

The getter material portions may be covered with a protective layer, for example comprising chromium or niobium and with a thickness of between several nanometres and several tens of nanometres (<100 nm). Such a protective layer may advantageously be deposited just after the getter material and in the same vacuum cycle, making it possible not to expose the getter material to contamination by the species that it is capable of subsequently trapping after having been thermally activated.

The getter material of one of the two parts may comprise grains with a substantially cylindrical shape and the getter material of the other of the two parts may comprise grains with a substantially conical and inclined shape.

The getter structure may comprise a plurality of getter portions arranged on the support in a regular pattern. Such a regular pattern may correspond, for example, to a matrix formed by a plurality of rows and a plurality of columns of getter portions, or to an alignment in a direction (for example, in a row or in a column), or a staggered or a honeycomb arrangement of the getter portions.

One of the two getter material parts of the getter portion may form a central part including an irregular contour, and the other of the two parts of getter material may form a peripheral part according to the irregular contour.

One of the two parts of getter material of the getter portion may form a first central part with a substantially constant thickness $h_1$ and the other of the two parts of getter material may form edges at least partially surrounding said first central portion, and of which the thickness varies between the thickness $h_1$ and a thickness $h_2 < h_1$.

The getter structure may comprise at least two getter material portions arranged one next to another and overlapping to form, between two getter material parts forming edges, a getter material part with a thickness $h_2$.

The getter structure may comprise at least two getter portions arranged one next to another and of which the edges may be juxtaposed, with the thickness $h_2$ capable of being zero.

The getter structure may comprise at least two adjacent getter portions spaced apart from one another by a non-zero distance, with the thickness $h_2$ being zero.

One embodiment of the invention also relates to a method for producing a getter structure, comprising at least one step of depositing, on a support, at least one getter portion through a mask including at least one opening passing through the mask and such that the getter portion is deposited through the opening of the mask, with the getter portion capable of including at least two adjacent getter material parts with different thicknesses and of which the densities of the surface grains, or microstructures, are different from one another.

The getter material parts of the getter structure are arranged on the support one beside the other.

One of the two getter material parts of the getter portion may form a first central part with a substantially constant thickness $h_1$ and the other of the two getter material parts may form edges at least partially surrounding said first central part and of which the thickness may vary between the thickness $h_1$ and a thickness $h_2 < h_1$, with the dimensions and the shape of the opening of the mask capable of corresponding substantially to the dimensions and the shape of the first central part of the getter portion.

The mask may comprise at least one first layer of material and one second layer of material so that, when the getter portion is deposited, the first layer of material may be arranged between the support and the second layer of material, with the first and second layers of material each comprising at least one opening forming the opening passing through the mask, with the dimensions of the opening formed through the first layer of material being capable of being greater than the dimensions of the opening formed through the second layer of material, which correspond substantially to the dimensions of the first central part of the getter portion.

The first and second layers of the mask may be arranged one against the other. The use of photosensitive resin films, which may be attached by rolling on the substrates and of which the thickness may reach around one hundred microns may be implemented to this end. A first photolithographed film may be covered with a second film of the same thickness or of a lower thickness, itself photolithographed according to openings smaller than that of the first film in order to define a mask directly in contact with the substrate.

The getter portion may comprise at least one getter material layer deposited by evaporation or by cathode sputtering through the opening of the mask.

One embodiment of the invention also relates to a device comprising at least one hermetic cavity in which at least one component and at least one getter structure as described above are encapsulated.

BRIEF DESCRIPTION OF THE DRAWINGS

The invention can be better understood in view of the following description of example embodiments provided purely as an indication, and which are in no way limiting, with reference to the appended drawings, in which.

Identical, similar or equivalent parts of the different figures described above have the same numeric references so as to facilitate reading between figures.

The different parts shown in the figures are not necessarily shown according to a uniform scale, in order to make the figures easier to read.

The different possibilities (alternatives and embodiments) must be understood as not being mutually exclusive and may be combined with one another.

DETAILED DESCRIPTION OF PARTICULAR EMBODIMENTS

Figure 1A:
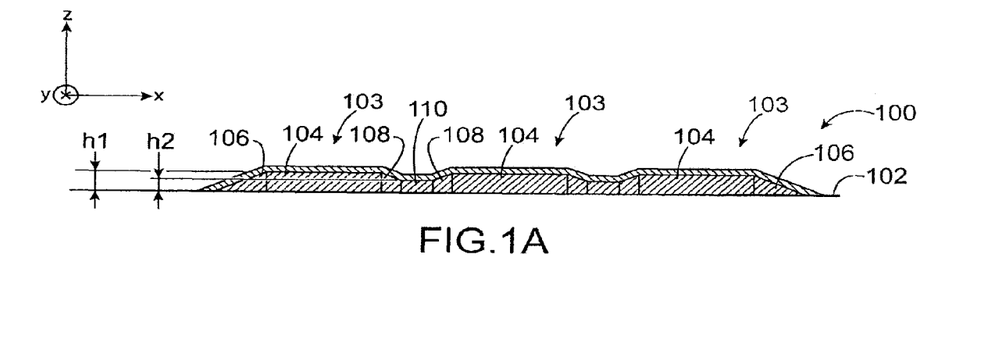
FIGS. 1A, 1B, 4A, 4B, 5A, 5B, 6 and 7 show getter structures according to different embodiments.
Figure 1B:
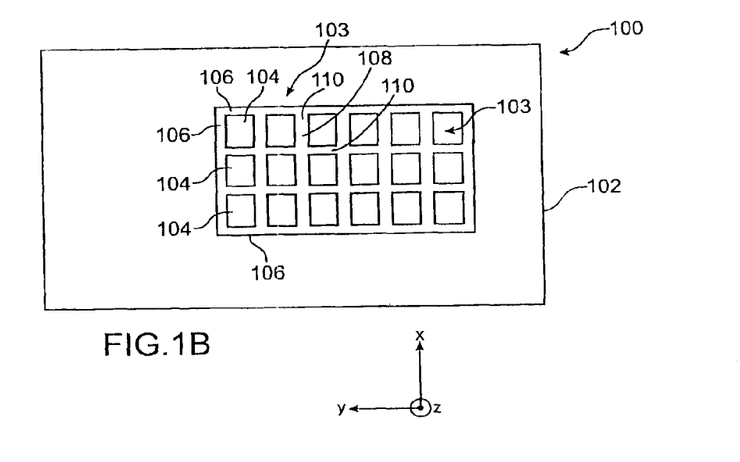

Reference is made to FIGS. 1A and 1B, which respectively show a profile cross-section view and a top view of a getter structure 100 according to a first embodiment.

The getter structure 100 is produced on a support 102, for example a substrate comprising a semiconductor such as silicon. The getter structure 100 is formed by a getter material layer having variable thicknesses over the entire surface of the getter structure 100. The getter structure 100 comprises a plurality of portions 103, or islands, of getter material arranged one next to another and comprising edges that, in the example of FIGS. 1A and 1B, overlap with one another. The portions 103 are, for example, arranged in a matrix (3 rows and 6 columns in the example of FIG. 1B). In FIG. 1B, the getter structure 100 comprises eighteen getter material portions 103.

Each portion 103 comprises parts 106 comprising a getter material forming edges and of which the thickness decreases from a maximum height, called $h_1$, corresponding to the thickness of a rectangular central part 104 of the portion 103. Thus, each of the portions 103 located at the periphery of the getter structure 100 comprises edges 106 of which the thickness decreases from the height $h_1$ to a height of zero corresponding to the limit, or to an edge, of the getter structure 100.

Each portion 103 also comprises parts 108 forming edges that are adjacent to other edges of adjacent portions 103. The thickness of the edges 108 decreases from the height $h_1$ to reach a part 110 of getter material common with another adjacent portion 103, having a height $h_2$ lower than $h_1$ and corresponding to an area of overlap of two parts 108 forming edges.

The getter structure 100 is therefore formed, in a main plane of the getter structure 100 (corresponding to a plane parallel to the plane (X, Y)) by a series of getter material parts with different thicknesses, as shown in FIG. 1A. However, these different parts of getter material have different microstructures due to the fact that the getter structure 100 is produced by deposition through a mask of which the number of openings corresponds to the number of getter material portions 103.

Figure 2A:
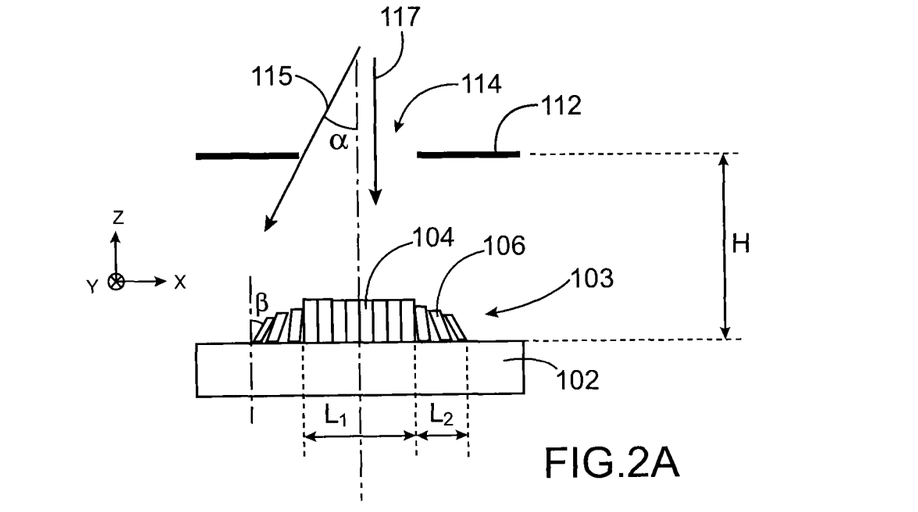
FIGS. 2A and 2B show getter material portions of a getter structure deposited on a support through openings in a mask.
Figure 2B:
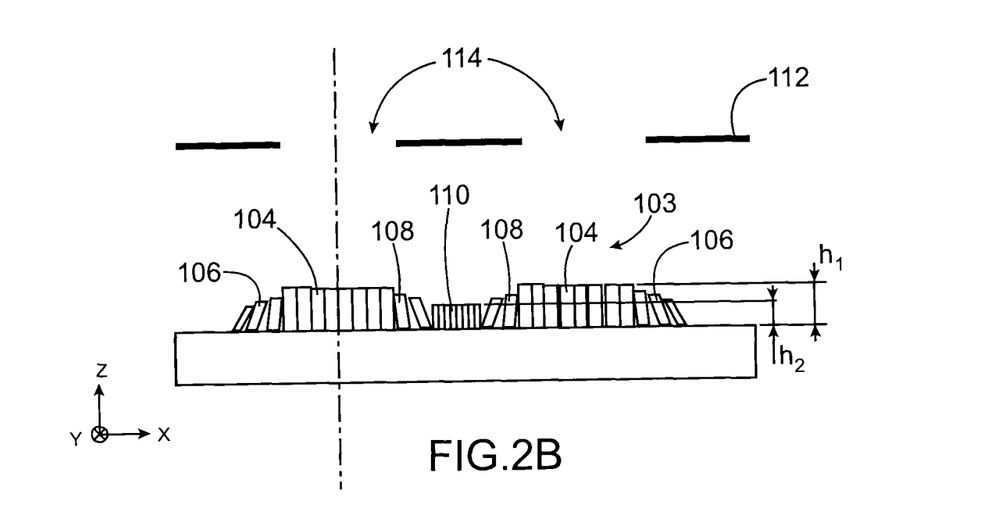

FIGS. 2A and 2B diagrammatically show getter material portions 103 deposited through openings 114 of a mask 112.

The openings 114 are arranged at a height H of the substrate 102. The deposition of the getter material, for example, performed by vacuum evaporation or cathode sputtering and with a deposition speed equal to around 10 A/s, through the openings 114, due to the distance H separating the mask 112 from the substrate 102, drives the formation of central getter material parts 104 (of width $L_1$) opposite the openings 114 and of parts forming edges 106 (of width $L_2$) under the portions of the mask 112 adjacent to the opening 114. In the example of FIG. 2B, the dimensions of the openings 112 are such that two parts 108 forming edges of two adjacent getter portions 103 partially overlap to form a common getter material part 110.

A method using evaporation is preferably performed in order to deposit the getter material portions 103, because, in this case, the intergranular porosity of the parts 106, 108 correspond to vacuum areas when the deposition is performed under a secondary vacuum, i.e. at a pressure below around $10^{-5}$ mbar. This porosity contributes to an increase in the pumping capacity of the getter. In the case of deposition by cathode sputtering under partial pressure of a carrier gas (argon or krypton, for example) for which care will have been taken to increase the angle $\alpha$ between the incident beams and the substrate 102, it is recommended to reduce the dimensions of parts 108 and to increase that of part 110.

The values of dimensions $L_1$ and $L_2$ are dependent on the dimensions of the opening 114, the value of the distance H, the angle of incidence of the beam of material in a deposition by cathode sputtering, and the deposition equipment used. By varying the dimensions of the opening 114, the value of $L_1$ is varied, and therefore the value of a surface $S_1$ is varied, in the plane (X, Y), corresponding to the getter material surface of the central part 104. By considering that the sum of the surfaces of the edges 106, 108 corresponds to a surface $S_2$ of getter material, the variation in dimensions of the opening 114 causes a variation in the ratio $S_1/S_2$ in the getter material portion 103.

As an example, for an opening 114 of a mask with a square shape with a side $L_1=100$ μm and a surface $S_1$ equal to around 1000 μm², beams of material with an angle α=2.5° and a distance H equal to around 500 μm, the length $L_2$ is equal to around 22 μm. The peripheral surface $S_2$ is therefore on the order of the surface $S_1$. For a matrix arrangement of these square elements, and in order for the parts 106 to be adjacent, it is therefore enough to use a template of which the spacing between the square openings has dimensions equal to around 44 μm. Thus, with a mask comprising two openings 114 with dimensions 100×100 μm² and separated by around 44 μm, a getter portion is produced comprising two getter material parts of surface $S_1$ each surrounded by a getter material part of surface $S_2$ of which the microstructure is different from those of the parts of surface $S_1$.

That is, $G_1$ and $G_2$ correspond respectively, in a getter portion 103, to the surface grain densities of the getter material of the central part 104 and of the getter material of the edges 106, 108. $G_1$ is thus smaller than $G_2$. Indeed, because the flow of material, during deposition of the getter portion 103, is lower in the shaded areas, i.e. under the mask 112, at the periphery of the opening 114, edge parts 106, 108 including a surface grain density $G_2$ greater than that of the central part 104 are obtained.

On the microscopic scale, for a single getter material surface, a getter material portion having a uniform grain structure produces a single activation temperature (or a reduced range of temperatures), while a getter material portion including a higher grain density (such as the edges 106 and 108 of the getter portions 103) and a columnar structure of the grains has a lower activation temperature, and, for the same getter thickness, a higher pumping capacity. The diffusion of gases in the thickness of the edges 106 and 108 of the getter material portions 103 is therefore easier than in the thickness of the central parts 104 of portions 103.

In addition, the diffusion of gases is easier in the getter material common part 110 for which a higher surface grain density is expected, by comparison with the diffusion in the central part 104.

It is therefore seen that by varying the ratio $S_1/S_2$ of the getter portions 103 of the structure 100, it is possible to vary the overall thermal activation temperature of the getter structure 100, or, at the same thermal budget, to vary the pumping capacity of the getter structure 100.

FIGS. 2A and 2B show that the getter material of portions 103 has a columnar structure (shown symbolically by rectangles and cones in these figures). The central parts 104 comprise grains aligned according to a normal to the substrate 102. By contrast, the edges 106 and 108 comprise columnar grains with a conical shape and inclined by a non-zero angle β with respect to the normal to the substrate 102. This inclination of the columnar grains of the edge parts 106 and 108 is due to the fact that the openings 114 of the mask 112 enable beams of material 115 inclined at a non-zero angle α with respect to the normal to the substrate 102 to pass. These beams of material 115 contribute to the formation of edge parts 106 and 108, while material beams 117 parallel to the normal to the substrate 102 contribute to the formation of the central parts 104. The document "Glancing angle deposition: Fabrication, properties, and applications of micro- and nanostructured thin films" by M. M. Hawkeye, Journal of Vacuum Science and Technology A: Vacuum, Surfaces and Films, Vol. 25(5) September 2007, pages 1317-1335, describes techniques for producing microstructures with inclined material beams capable of being implemented in order to produce the getter structure 100.

The structure of the grains of the central parts 104 is columnar, and the size of the grains of these parts of getter material is dependent on the ratio between the deposition and melting temperatures of the deposited material expressed in Kelvin, and which is, for example, below to around 0.3. The material beams that form parts 106 and 108 are inclined by an angle α with respect to the normal to the substrate 102, leading to the formation of grains inclined by an angle β with respect to the substrate 102, of which the diameter and the height decrease with distance from the central part 104, while the inclination will increase. Indeed, angle β is associated with angle α according to the relation $tg(α)=2.tg(β)$. The shading phenomenon causes the formation of intergranular spaces and leads to a porous structure. In the case of the common part 110, the shading phenomena are compensated in order to form a denser structure than that of parts 106 and 108, with a lower thickness and a smaller grain size than in the central part 104.

Figure 3A:
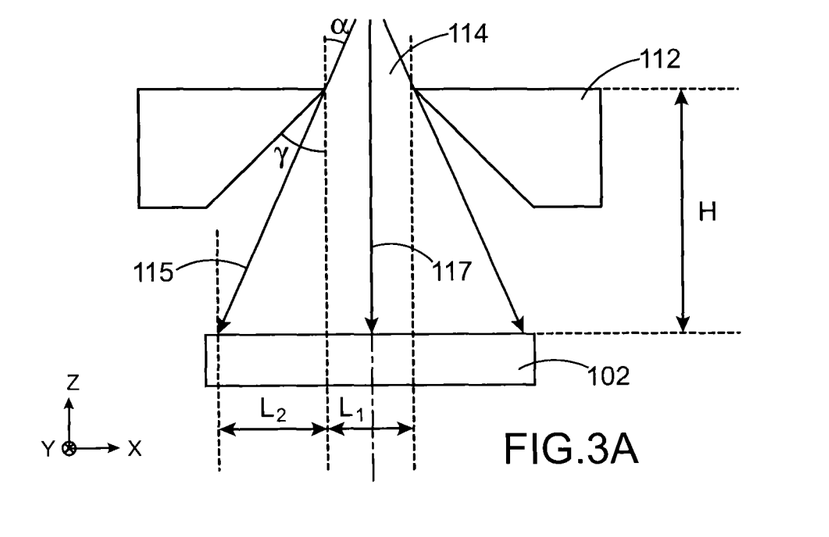
FIGS. 3A and 3B diagrammatically show masks capable of being used to produce a getter structure.
Figure 3B:
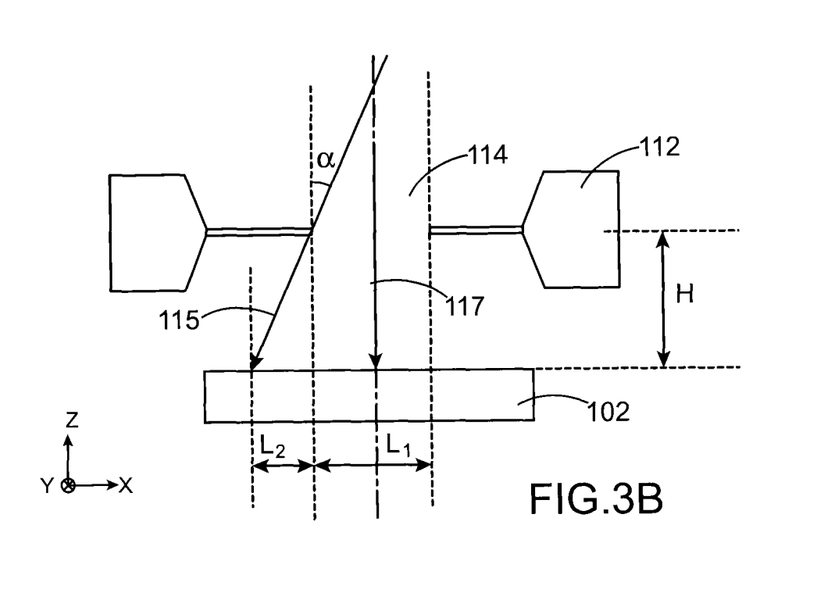

FIGS. 3A and 3B show the beams 115 and 117 passing through the masks 112 having openings 114 with different dimensions, causing the formation of getter portions 103 of which the ratios of dimensions $L_1$ and $L_2$ are different. It is seen in these figures that the dimension $L_1$ is directly dependent on the dimensions of the opening 114, and that the dimension $L_2$ is dependent in particular on the angle α that can be adopted by the inclined material beams 115. It is also seen that the opening 114 of the mask 112 shown in FIG. 3A has a funnel shape (forming an angle γ with respect to the normal to the substrate 102) enabling a larger opening for the more inclined material beams. In the example of FIG. 3B, the mask 112 has a lower thickness at the level of the opening 114 with respect to the rest of the mask 112. In this example, the distance H between the mask 112 and the substrate 102 is less than that of the example of FIG. 3A, even though the dimension $L_1$ is greater than that of FIG. 3A.

Figure 3C:
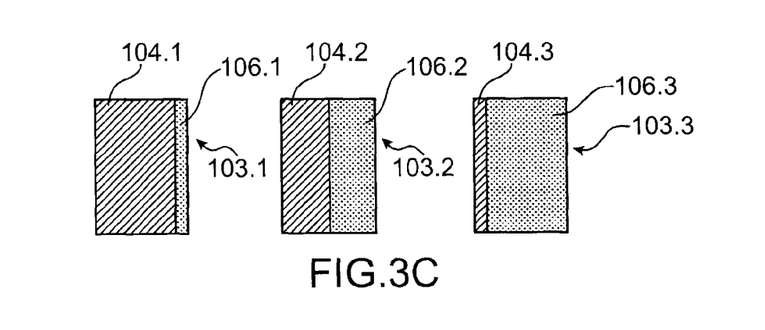
FIG. 3C diagrammatically shows different types of getter material portions of a getter structure.

The mask may have a plurality of design alternatives according to the angle of opening γ. This angle defines the accessibility of the inclined beams to the area where the parts 106, 108 and 110 are intended to be produced. The greater the value of γ is, the larger $L_2$ may be. The value of γ is dependent on the shape of the opening 114 and the distance H between the opening 114 and the substrate 102. The shapes of the masks shown in FIGS. 3A and 3B are capable of being produced by photolithographic and etching techniques on a silicon substrate, for example. Wet anisotropic etching (with a KOH bath) makes it possible to define inclined planes in a monocrystalline silicon substrate, while a deep reactive ion etching (DRIE) enables the silicon to be hollowed out according to vertical flanks. It is also possible to use these types of etching on the same substrate. FIG. 3C shows diagrammatic distribution examples of surfaces $S_1$ and $S_2$ in getter material portions 103.1, 103.2 and 103.3 and the influence of these distributions on the thermal activation temperatures of these portions. These portions are obtained by a titanium deposit performed by secondary vacuum evaporation deposited for example at a deposition rate of several tens of nanometres per second. For getter portion 103.1 of which the surface $S_1$ represents a major portion of the total surface of the getter material 103.1 (for example, $S_1/S_2>2$), the thermal activation temperature of this portion 103.1 is, for example, equal to around 400° C. For the getter portion 103.2 of which the surface $S_1$ is approximately equal to that of surface $S_2$ (for example, $S_1/S_2=1$), the thermal activation temperature of this portion 103.1 is, for example, equal to around 325° C. Finally, for the getter portion 103.3 of which the surface $S_2$ represents a major portion of the total surface of the getter material 103.3

(for example, $S_1/S_2<0.5$), the thermal activation temperature of this portion 103.3 is, for example, equal to around 250° C.

In the getter structure 100 described above in reference to FIGS. 1A and 1B, the surface density of the grains of parts 110 located between two edges 108 is different from those of the central parts 104 and the edges 106, 108. There is therefore, in the getter structure 100, a juxtaposition of getter material parts having different microstructures, and in particular different surface grain densities, and therefore different thermal activation temperatures.

Figure 4A:
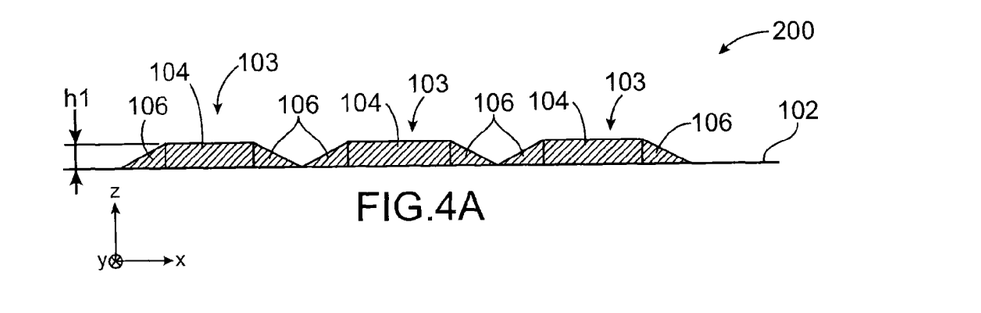
Figure 4B:
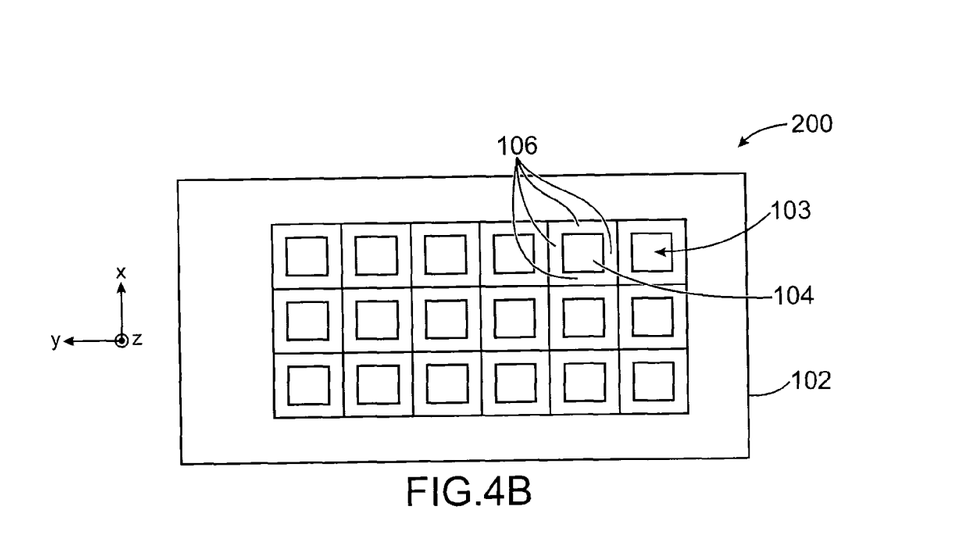

FIGS. 4A and 4B show a getter structure 200 according to a second embodiment.

The getter structure 200 comprises the same number of getter material portions 103, arranged in the form of a 3×6 matrix, as the getter structure 100. Unlike the getter structure 100 described above in reference to FIGS. 1A and 1B, the getter structure 200 shown in FIGS. 4A and 4B comprises getter material portions 103 of which the edges 106 of two adjacent portions 103 touch one another without overlapping. Thus, each getter material portion 103 is in this case formed by a central portion 104 surrounded by four edges 106 of which the thickness decreases from $h_1$ to a height of zero. In this alternative embodiment, the getter structure 100 does not comprise a getter material portion 110 of height $h_2$ and common to two adjacent getter material portions 103, because the edges 106 of two adjacent portions 103 do not overlap. The getter material portions are juxtaposed.

The getter structure 200 therefore has a higher ratio $S_1/S_2$ than that of the getter structure 100. Thus, for a getter material of the same type, the getter structure 200 has a thermal activation temperature higher than that of the getter structure 100, or, at an equivalent thermal budget, a gas pumping capacity lower than that of the getter structure 100.

Figure 5A:
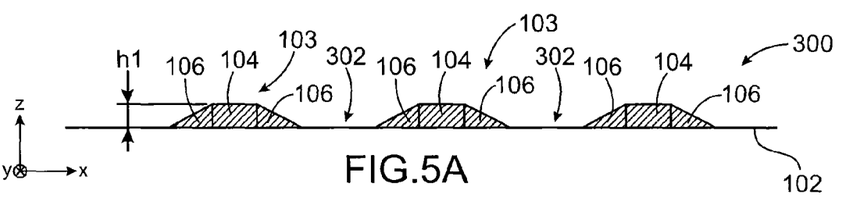
Figure 5B:
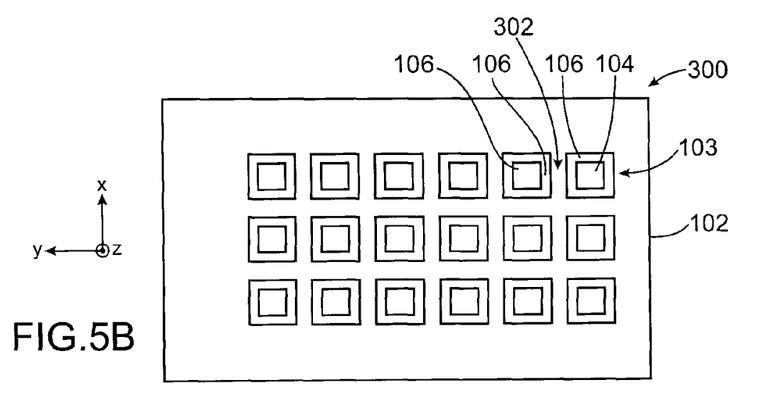

FIGS. 5A and 5B show a getter structure 300 according to a third embodiment.

The getter structure 300 comprises the same number of portions (18 in all) of getter material 103, arranged in the form of a 3×6 matrix, as the getter structures 100 and 200. Like the getter structure 200, the edges 106 of the getter material portions 103 do not overlap (there are therefore no portions 110).

In addition, because the dimensions (such as dimension $L_1$) of the central parts 104 of portions 103 are reduced with respect to those of portions 103 of the getter structure 200, the edges 106 of adjacent getter material portions 103 do not touch and are separated by an empty space 302.

The getter structure 300 has, for the same getter material, a thermal activation temperature identical to that of the getter structure 200, or, at an equivalent thermal budget, a lower gas pumping capacity than that of the getter structure 200, since all of the surfaces $S_1$ of this getter structure 300 is smaller than that of the getter structure 200.

The different examples of getter structures 100, 200 and 300 described above show that, from the same getter material and on the same surface (the surfaces occupied by the getter structures 100, 200 and 300 on the substrate 102 are substantially equal), it is possible to produce getter structures having different thermal activation temperatures and/or having different gas pumping capacities according to the shape of the getter material portions 103 forming the getter structure.

If it is sought to reduce the thermal activation temperature of a getter structure, it is possible, for the same surface, to produce this getter structure so that the periphery of the getter material portions is increased, i.e. there is an increase in the total length of edges (the perimeter) of the getter structure of which the thickness varies as described for the edges 106 or 108 of the getter structures 100, 200 or 300.

Figure 6:
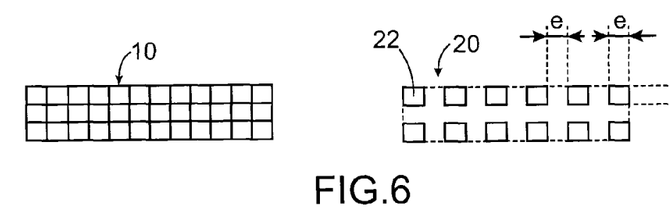

This increase of the edges with respect to the rest of the getter material may optionally occur by reducing the total getter material surface. FIG. 6 shows this principle by comparing two getter structures 10 and 20 occupying the same surface.

The getter structure 10 is formed by a single rectangular portion of getter material occupying a surface S. When this surface S is considered to correspond to 33 squares arranged one next to another and with sides equal to e, then $S=33 \times e^2$. The perimeter P of this rectangular getter material portion is such that $P=28 \times e$. For the getter structure 20, a surface equal to that occupied by the getter structure 10 is no longer occupied by a single rectangular getter material portion, but by 12 separate square getter material portions 22 with sides equal to e. The distance separating two getter material portions 22 is also equal to e.

For this getter structure 20, the getter material surface S is such that $S=12 \times e^2$. The overall perimeter P of the getter structure 20 corresponds to the sum of the perimeters of the getter material portions 22, and is equal to $48 \times e$. Because the perimeter e of the getter material portions of the getter structure 20 is greater than that of the getter material portions of the getter structure 10, the getter structure 20 therefore comprises a smaller ratio $S_1/S_2$ than that of the getter structure 10, and therefore a lower thermal activation temperature than that of the getter structure 10.

It is seen that, for the same surface and using the same getter material, it is possible to produce getter structures having different thermal activation temperatures and different gas pumping capacities.

It is possible to produce a getter structure comprising a plurality of getter material portions that are separate or not, of which the edges overlap or not, in order to increase the proportion of getter material forming a getter material part with a variable thickness. It is also possible for each of the getter material portions to have irregular edges, enabling the ratio $S_1/S_2$ of the getter structure to be even further reduced, and therefore the thermal activation temperature of the getter structure to be reduced.

In the getter structures 100, 200 and 300 described above, the getter material portions have a rectangular shape (in a main plane of the getter structure). In an alternative embodiment of these getter structures 100, 200 and 300, the getter material portions 103 may have a different shape and be produced with a polygon shape, for example a hexagon shape.

Figure 7:
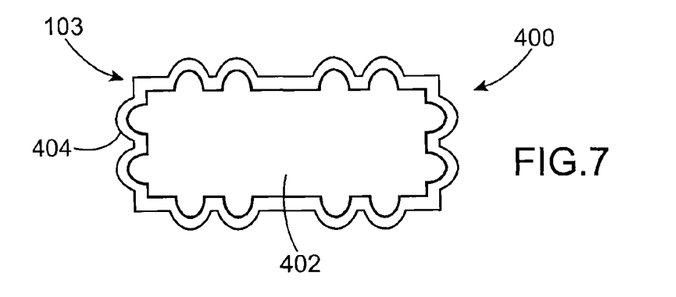

FIG. 7 shows another example embodiment of a getter structure 400.

Unlike the getter structures 100, 200 and 300 described above formed by a plurality of getter material portions arranged in the form of a matrix, the getter structure 400 comprises a single portion 103 of which a central getter material portion 402 includes a perimeter that is not regular, forming semi-circles in this example. Edge parts 404, similar to the parts 106 described above, i.e. comprising a decreasing thickness when moving away from the central part 402, of this getter portion 103, follow the same irregular perimeter of the central part 402.

Thus, with respect to a getter structure having a rectangular shape and an equivalent surface, the getter structure 400 has a lower thermal activation temperature because its ratio $S_1/S_2$ is below that of the getter structure with a rectangular shape and an equivalent surface.

The getter material portions of the getter structures 100, 200, 300 and 400 are produced by deposition through a mask (for example, similar to the mask 112 described above), for example, a hard mask such as a silicon plate with holes, comprising openings corresponding to the different portions of getter material to be deposited. Such a mask may also be resin-based, produced in the form of a dry film with a thickness, for example, equal to around 100 μm. The mask may be arranged against the support on which the getter material portions are produced. In this case, the dimensions of the openings of the mask located on the side of the face of the mask arranged against the support are greater than the dimensions of these openings at the level of the opposite face of the mask.

Figure 8:
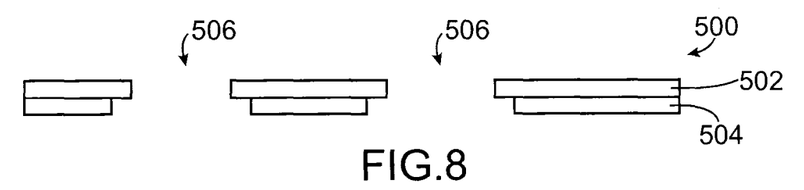
FIG. 8 shows a mask used in a method for producing a getter structure.

A part of such a mask 500 is shown in FIG. 8. This mask 500 is formed by two layers 502, 504, for example based on a semiconductor, secured to one another. Two openings 506 formed through the mask 500 are shown in FIG. 8. It is seen that the dimensions of an opening 506 in the lower layer 504 (layer intended to be located on the side of the getter structure produced) are greater than those of this same opening 506 in the upper layer 502. The pattern of the openings 506 corresponds to the shape of the getter material portions to be produced. The mask 500 may be formed by two layers, or more than two layers, of material, which may or may not be secured to one another. Thus, the layer 504 of the mask 500 might be arranged against the support on which the getter material is intended to be deposited, while the layer 502 may not be in contact with the layer 504 and be arranged at a distance H from the support, with this distance H being greater than the thickness of the layer 504, during deposition. The openings 506 of these layers 502 and 504 may be produced by wet etching on one side and deep reactive ionic etching on the other side, leaving, at the base of the etching, a thin silicon film on the peripheries of the patterns.

Each of the layers 502, 504 may also be produced by deep reactive ionic etching of small patterns (for example, with a depth equal to around 100 μm) in a semiconductor plate or wafer, then by temporary bonding of the plate on a handle, thinning (for example around 80 μm for a plate with a thickness equal to around 100 μm), separation and re-bonding on a plate drilled with rough patterns corresponding to the total surface of the getter material to be deposited.

When the mask used for the deposition of the getter material portions 103 is a dry resin-based film, it may be produced by rolling one or more resin layers, with a thickness, for example, equal to around one hundred micrometers, then insulation and development under particular conditions.

When the mask is formed by a plurality of dry film layers including openings with different dimensions (such as the mask 500 shown in FIG. 8), successive steps of rolling and photolithography are implemented for these different layers.

After having deposited the getter material on the support 102, this getter material may undergo in situ passivation, i.e. dry nitriding or oxidation, for example at a temperature of around 100° C. for several minutes for a gas pressure greater than around $10^{-2}$ mbar, generally implemented after the deposition of the getter material. When the mask used to deposit getter material portions 103 is arranged against the support 102, the mask is then detached from the support 102 or, when it is made of resin, the mask may be removed by a stripping lift-off operation.

As an alternative to this in situ passivation method, the getter material may be protected by a layer, for example, of chromium or niobium, with a thickness between several nanometres and several dozen nanometres (for example <100 nm), advantageously produced by a deposition performed immediately after that of the getter material.

For all of the getter structures described above, the getter material used is, for example, titanium, zirconium or chromium, or a metal alloy comprising of one or more of these metals, or of any other material or alloy having gas absorption and/or adsorption properties.

Figure 9:
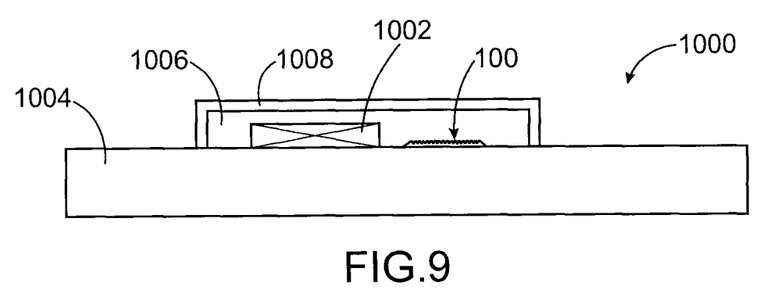
FIG. 9 shows a device including a getter structure.

FIG. 9 shows a device 1000 including a microsystem 1002 formed on a substrate 1004 and encapsulated in a hermetic cavity 1006 formed between the substrate 1004 and a cap 1008. A getter structure, for example the getter structure 100 described above in reference to FIGS. 1A and 1B, is also encapsulated in the cavity 1006. The getter structure 100 enables a vacuum to be produced, for example of $10^{-3}$ mbar, in the cavity 1006.

In an alternative, the getter structure encapsulated in the cavity 1006 might be any of the getter structures described above.

In addition, the getter structure might also not be produced on the substrate 1004, but instead against the wall of the cap 1008 intended to be arranged on the side of the cavity 1006.

The invention claimed is:

1. A getter structure comprising:
    at least one getter portion arranged on a support and including
        at least two adjacent getter material parts arranged on the support one beside the other and having a common surface disposed on the support, with different thicknesses and of which the surface grain densities are different from one another, the thicknesses measured from the common surface and in a direction normal to the common surface.

2. The getter structure according to claim 1, in which the getter portion comprises at least one getter material layer.

3. The getter structure according to claim 2, in which the getter material layer comprises titanium or zirconium.

4. The getter structure according to claim 2, in which the getter material layer covers at least one other layer of material of the getter structure.

5. The getter structure according to claim 2, in which the getter material layer is protected by a protective layer.

6. The getter structure according to claim 1, in which the getter material of one of the two parts comprises substantially cylindrical grains and the getter material of the other of the two parts comprises substantially conical and inclined grains.

7. The getter structure according to claim 1, comprising a plurality of getter portions arranged on the support according to a regular pattern.

8. The getter structure according to claim 1, in which one of the two getter material parts of the getter portion forms a central part including an irregular contour, and the other of the two getter material parts forms a peripheral part following the irregular contour.

9. The getter structure according to claim 1, in which one of the two getter material parts of the getter portion forms a first central part with a substantially constant thickness h1, and the other of the two getter material parts forms edges at least partially surrounding said first central part and of which the thickness varies between the thickness h1 and a thickness h2 <h1.

10. The getter structure according to claim 9, comprising at least two getter portions arranged one next to the other and overlapping, forming, between two getter material parts forming the edges, a getter material part with a thickness h2.

11. The getter structure according to claim 9, comprising at least two getter portions arranged one next to the other and of which the edges are juxtaposed, with the thickness h2 being zero.

12. The getter structure according to claim 9, comprising at least two getter portions that are adjacent and spaced apart from one another by a non-zero distance, in which the thickness h2 is zero.

* * * * *